United States Patent [19]

Chang et al.

[11] Patent Number: 5,021,748

[45] Date of Patent: Jun. 4, 1991

[54] CIRCULAR RING RESONATOR DISTRIBUTIVE ELECTROMAGNETIC SIGNAL PROCESSOR

[75] Inventors: Kai Chang; Henry F. Taylor, both of College Station, Tex.

[73] Assignee: The Texas A & M University System, College Station, Tex.

[21] Appl. No.: 422,970

[22] Filed: Oct. 18, 1989

[51] Int. Cl.$^5$ ............................................. H03F 3/60
[52] U.S. Cl. ..................................... 330/286; 330/287
[58] Field of Search ................... 330/53, 56, 277, 286, 330/287, 295, 308; 333/204, 219, 222, 246, 247

[56] References Cited

U.S. PATENT DOCUMENTS

| 4,291,278 | 9/1981 | Quine | 330/286 |
| 4,600,894 | 7/1986 | Dydyk | 330/287 |

OTHER PUBLICATIONS

K. Chang, S. Martin, F. Wang, J. L. Klein, "On the Study of Microstrip Ring and Varactor-Tuned Ring Circuits", *IEEE Transactions on Microwave Theory and Techniques*, vol. MTT-35, No. 12, Dec. 1987.

D. S. McGregor, C. S. Park, M. H. Weichold, H. F. Taylor, K. Chang, "Optically Excited Microwave Ring Resonators in Gallium Arsenide", *Microwave and Optical Technology Letters*, vol. 2, No. 5, May 1989.

T. S. Martin, F. Wang, K. Chang, "Theoretical and Experimental Investigation of Novel Varactor-Tuned Switchable Microstrip Ring Resonator", *IEEE Transactions on Microwave Theory and Techniques*, vol. 36, No. 12. Dec. 1989.

*Primary Examiner*—Steven Mottola
*Attorney, Agent, or Firm*—Arnold, White & Durkee

[57] ABSTRACT

An electromagnetic signal processor is disclosed comprising an input waveguide, an intermediate waveguide, and an output waveguide. The intermediate waveguide comprises two portions having substantially equal electromagnetic impedances. The two portions of the intermediate waveguide are coupled to each other at a first and a second junction. The input and output waveguides are electromagnetically coupled to the intermediate waveguide at the first and the second junctions, respectively. Electrically coupled to the intermediate waveguide is a semiconductor device responsible for processing input electromagnetic signals. The input waveguide functions to receive and direct an input electromagnetic signal to the first junction of the intermediate waveguide. At the first junction, the intermediate waveguide separates the input signal into two signals having substantially equal amplitudes. Each of the separate signals propagates along one of the two portions of the intermediate waveguide and as they propagate, the separate signals are processed by the semiconductor device. At the second junction, the separate signals recombine to form a single output signal and this output signal is transmitted via the output waveguide.

24 Claims, 7 Drawing Sheets

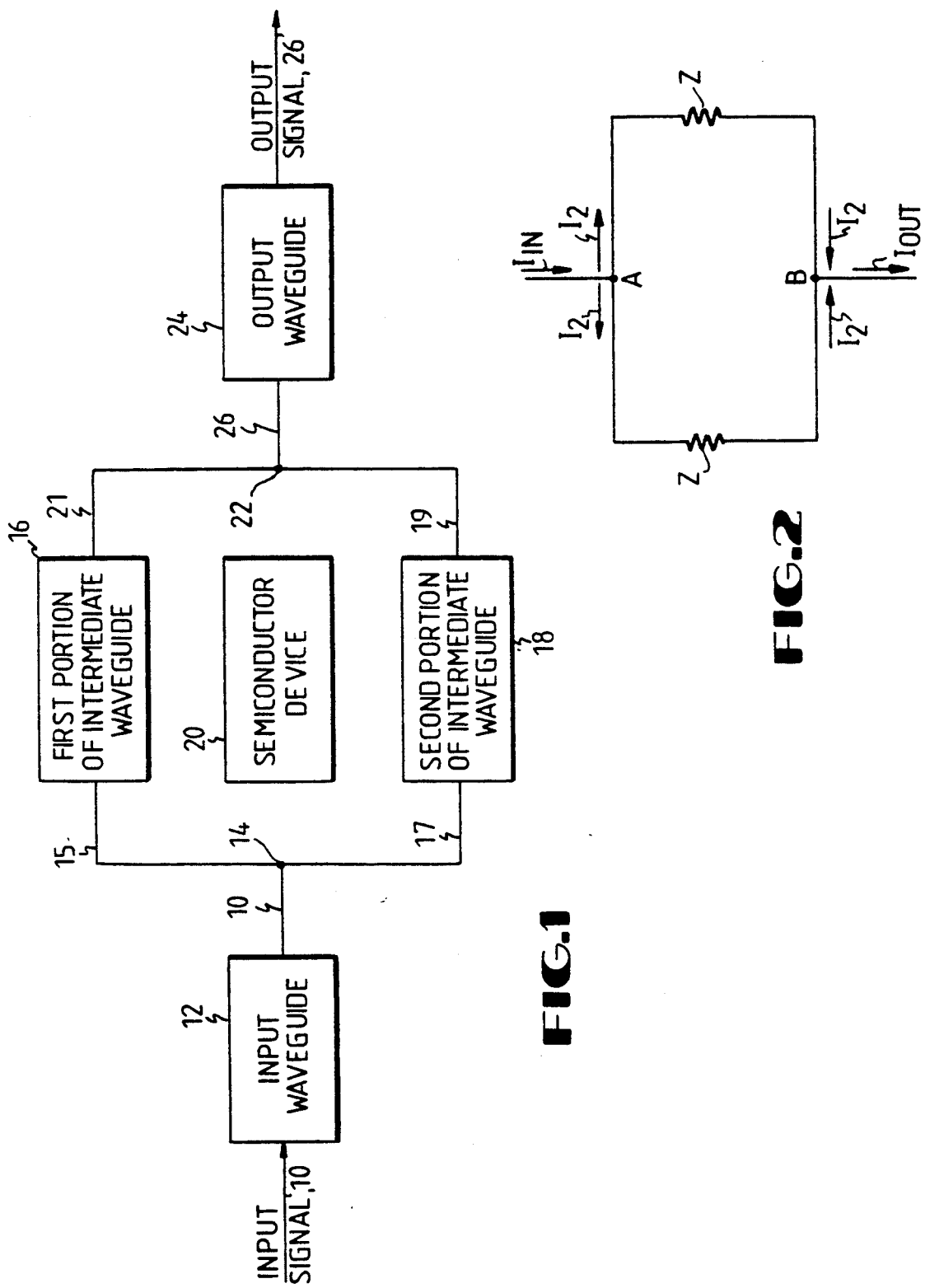

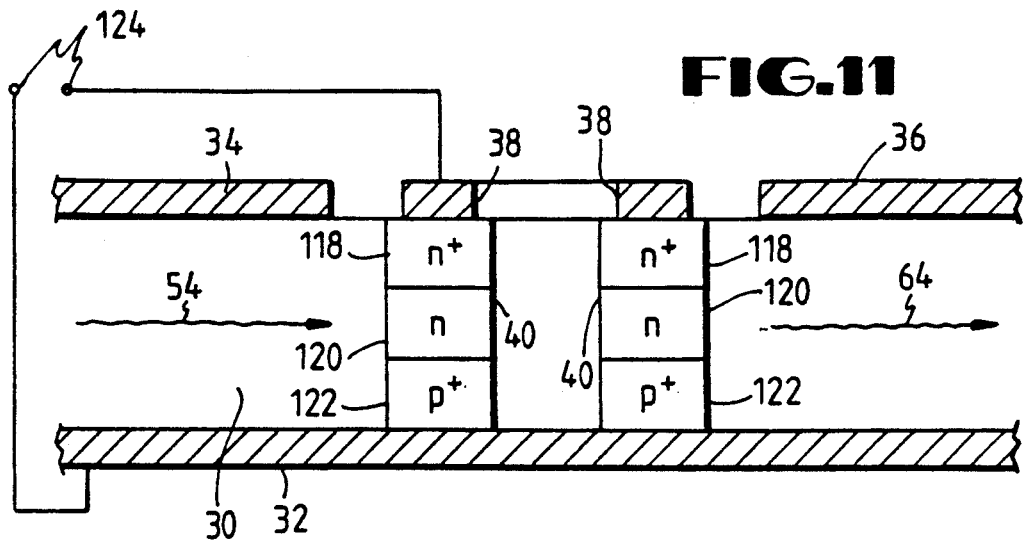
FIG.11
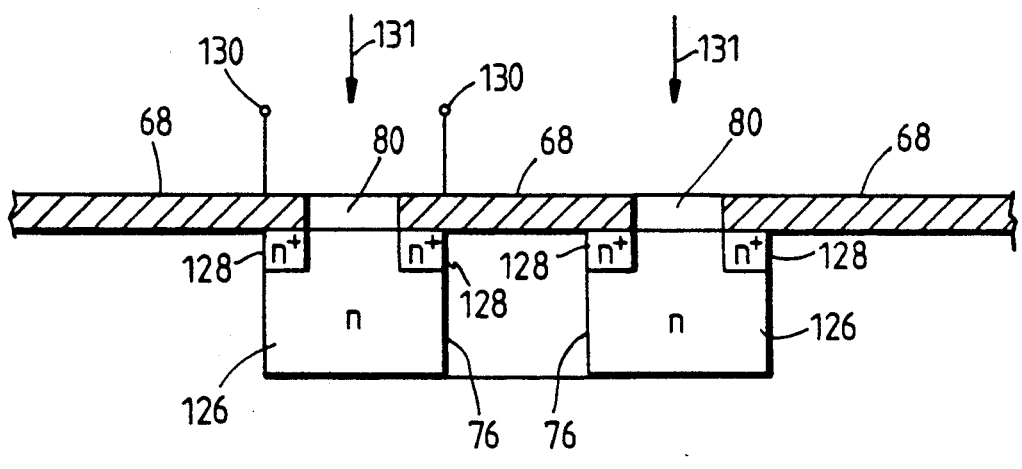
FIG.12
FIG.13
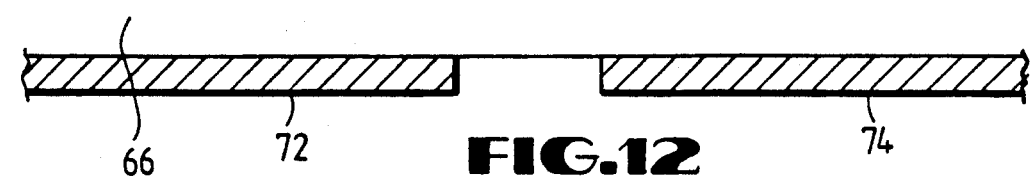

CIRCULAR RING RESONATOR DISTRIBUTIVE ELECTROMAGNETIC SIGNAL PROCESSOR

FIELD OF THE INVENTION

This invention relates to signal processors and, more particularly, to a circular ring resonator distributive electromagnetic signal processor.

BACKGROUND

Electromagnetic signal processing devices, especially those operating in the microwave range, are widely used in industry today and are especially prevalent in the fields of radar, communications, and electronic warfare systems. Existing devices include oscillators, amplifiers, switches, modulators, demodulators, and non-linear transmission lines, among others.

One prior art system which may be relevant to the present invention is the radial disc resonator oscillator/amplifier of U.S. Pat. No. 4,600,894 as issued to Dydyk. The Dydyk system comprises a substrate having a hole extending therethrough, a radial disc resonator disposed on one face of the substrate such that it covers the hole, a microstrip conductor with a predetermined width disposed on the same face as the radial disc resonator, and a negative impedance device disposed below the hole on the side of the substrate opposite that of the radial disc. This system is designed to offer two degrees of freedom so that the external quality factor as well as the output coupling coefficient is selectable.

The Dydyk system has several drawbacks, however. Due to the nature of its structure, the Dydyk invention is very difficult to fabricate monolithically; thus, it is expensive to produce in large quantities. Another drawback is that each individual structure performs one and only one discrete function. If a plurality of functions should be desired, a plurality of structures would be needed. This is economically infeasible as well as space-inefficient.

Another relevant signal processing device is a linear structure microwave amplifier that receives input microwave signals at one end and amplifies the signals as they propagate to the other end. Because this structure extends in only one dimension, it is relatively long, hence, requiring more space than would be preferable. The linear structure also suffers from end effects and has difficulty in providing a good matching impedance for incoming electromagnetic signals. This causes portions of the input signals to be reflected, resulting in a partial loss of the input signal.

SUMMARY OF THE INVENTION

From the foregoing discussion, it is clear that the prior art signal processors have suffered from several shortcomings. Therefore, it is a general object of the present invention to address the problems of the prior art and to provide an improved electromagnetic signal processor which provides better solutions to the problems.

In accordance with the invention, a signal processor is provided comprising an input waveguide, an output waveguide, an intermediate waveguide comprising two branches or portions having substantially equal electromagnetic impedances coupled to each other at a first and a second junction to form a closed geometric configuration, and a semiconductor device electrically coupled to the intermediate waveguide. The input and output waveguides are electromagnetically coupled to the intermediate waveguide at the first and the second junctions, respectively.

The input waveguide receives an input electromagnetic signal and directs this signal to the first junction of the intermediate waveguide. At the first junction, the intermediate waveguide divides the input signal into two separate signals with each of the two separate signals propagating along one of the two branches of the intermediate waveguide. As the two separate signals propagate along the branches of the intermediate waveguide, they are operated upon by the semiconductor device. When both of the separate signals arrive at the second junction, they recombine to form a single output electromagnetic signal which is thereafter transmitted via the output waveguide.

A first preferred embodiment of the invention comprises a semiconductor substrate, a layer of conductive material disposed on a first face of the substrate, a circular microstrip ring disposed on a second and opposite face of the substrate, an input and an output microstrip line disposed on the second face of the substrate on opposite sides of the microstrip ring, and a semiconductor device formed within the substrate directly beneath the microstrip ring.

In this embodiment, the input microstrip line and the conductive layer form the input waveguide, and the output microstrip line and the conductive layer form the output waveguide. The intermediate waveguide is formed by the microstrip ring and the conductive layer. The input and the output microstrip lines are positioned relative to the microstrip ring such that they are electromagnetically coupled to the microstrip ring at a first and a second junction, respectively. The two junctions are strategically placed such that they divide the microstrip ring into two branches or portions having substantially equal electromagnetic impedances.

A second preferred embodiment of the invention comprises a semiconductor substrate, a layer of conductive material having an annular ring cut away, an input and an output microstrip line, and a semiconductor device formed within the semiconductor substrate. The layer of conductive material is disposed on a first face of the semiconductor substrate, covering the face of the substrate except for an annular portion which is left exposed. The exposed annular portion is called a slotline ring. Directly below the slotline ring, the semiconductor device for processing input signals is fabricated. The two microstrip lines are disposed on a second face of the semiconductor substrate directly below and on opposite sides of the slotline ring. One end of each of the microstrip lines is vertically aligned with a portion of the slotline ring in order to electromagnetically couple the microstrip line to the ring. The two microstrip lines are electromagnetically coupled to the slotline ring at a first and a second junction, and like the first embodiment, these junctions are strategically placed to divide the slotline ring into two branches having substantially equal electromagnetic impedances. The two microstrip lines must also be separated from each other by a distance sufficient to electromagnetically decouple them so that they do not form a continuous path.

In this embodiment, the input waveguide is formed by the input microstrip line and the conductive layer, and the output waveguide is formed by the output microstrip line and the conductive layer. The slotline ring behaves as the intermediate waveguide by allowing electromagnetic signals to propagate between its conductive walls. As the signals propagate between the walls of ring, they are operated upon by the semiconductor device fabricated beneath the ring.

Both of the above embodiments of the present invention provide several distinct advantages over the prior art. First, both embodiments comprise monolithic, distributive structures which can be easily and economically massproduced. Also, the distributive structures of both embodiments make them quite conducive to accommodating a multiplicity of devices on a single structure. Thus, each individual signal processor may be capable of performing a multiplicity of functions.

In addition, the ring structures (the microstrip ring and the slotline ring) of both embodiments provide improved impedance characteristics when compared to the linear structure of the prior art.

Furthermore, when used as an amplifier, the ring structures provide higher gain than the linear structure of the prior art.

The second of the two preferred embodiments provides an additional advantage in that it may be optically controlled. Because the slotline ring leaves the semiconductor device exposed, optical signals may be easily coupled to the semiconductor device to control its operation. However, the second embodiment may be more difficult to produce than the first so that the extra advantage should be weighed against possible added cost of production.

Regardless of which specific embodiment of the invention is employed, the signal processors of the present invention generally provide better results, at a lower cost, than the prior art.

BRIEF DESCRIPTION OF THE DRAWINGS

FIG. 1 is a block diagram illustrating the general components of preferred embodiments of the invention.

FIG. 2 is an electrical schematic showing the splitting of an electrical current when two parallel paths having identical impedances are encountered.

FIG. 11 shows an IMPATT distributive amplifier implemented using the embodiment of the invention shown in FIG. 3.

FIG. 12 shows a Gunn-effect device implemented utilizing the embodiment of the invention shown in FIG. 7.

FIG. 13 is a circuit diagram showing the Gunn device of FIG. 12 and its attached circuit load.

DETAILED DESCRIPTION

Figure 3:
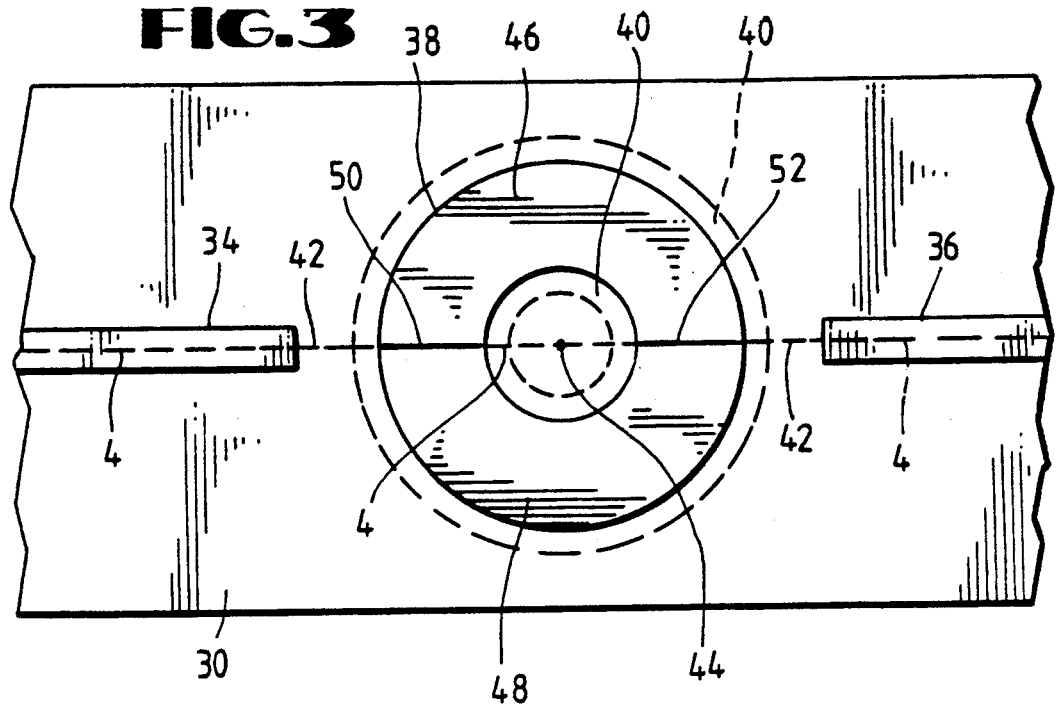
FIG. 3 is a top view of a first preferred embodiment of the invention.

With reference to FIG. 1, a block diagram is shown illustrating the basic components of the invention comprising an input waveguide 12, an intermediate waveguide having a first branch 16 and a second branch 18 portion coupled to each other at a first 14 and a second 22 junction, an output waveguide 24, and a semiconductor device 20 electrically coupled to at least one of the portions of the intermediate waveguide. The input waveguide 12 is electromagnetically coupled to both portions 16 and 18 of the intermediate waveguide at the first junction 14, and the output waveguide 24 is electromagnetically coupled to both portions 16 and 18 of the intermediate waveguide at the second junction 22. The two portions 16 and 18 of the intermediate waveguide are preferably designed such that they have substantially equal electromagnetic impedances.

The input waveguide 12 receives an input electromagnetic signal 10 and directs it towards the first junction 14. At junction 14, the input signal 10 encounters two parallel paths or branches 16 and 18 haVing substantially equal electromagnetic impedances. An electrical analogy of this situation is illustrated in FIG. 2 wherein current $I_{in}$ arrives at junction A and encounters two parallel paths having the same impedance Z. As shown in FIG. 2, the current $I_{in}$ separates into two equal half-currents $I_2$ with each half-current flowing through one of the two impedances Z. After flowing through the two impedances Z, the two half-currents $I_2$ recombine at junction B to form a single output current $I_{out}$. A similar phenomenon occurs with the input signal 10 in FIG. 1. Because portions 16 and 18 have substantially equal electromagnetic impedances, input signal 10 splits into two separate electromagnetic signals 15 and 17 having substantially the same amplitude, and each separate signal propagates along one of the two paths 16 and 18 of the intermediate waveguide. As the signals 15 and 17 propagate along the two paths 16 and 18 of the intermediate waveguide, the semiconductor device 20 functions to process the separate signals 15 and 17 according to predetermined specifications to convert them to newly processed signals 19 and 21. The newly processed signals 19 and 21 recombine in phase at junction 22 to form a single output signal 26 which is thereafter transmitted via output waveguide 24.

Figure 4:
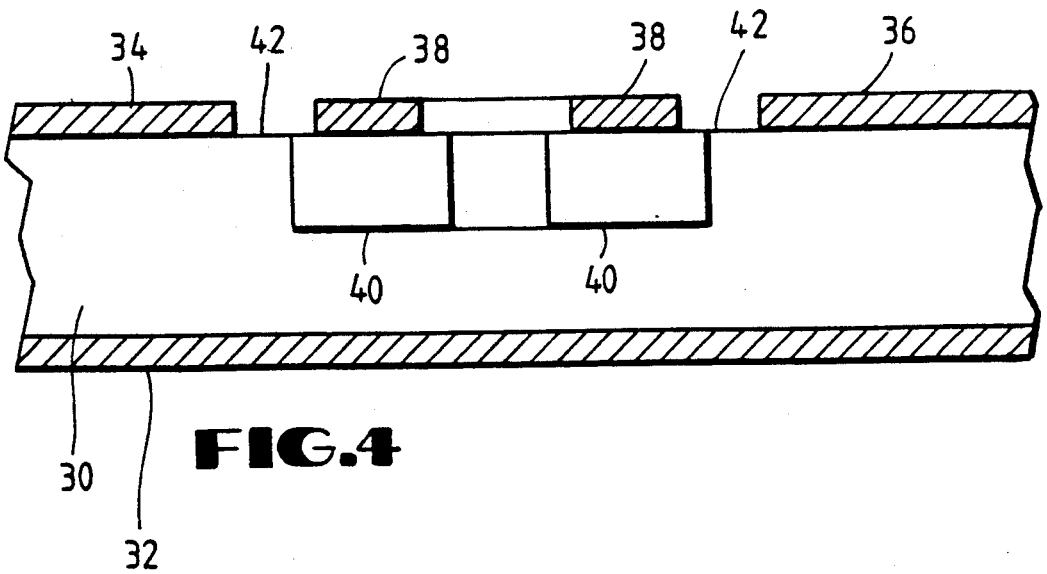
FIG. 4 is a cross-sectional view of the first embodiment of FIG. 3 taken along the section lines 4—4.

Referring to FIGS. 3 and 4, a first preferred embodiment of the invention comprises a semiconductor substrate 30, a layer of conductive material 32, an input microstrip line 34, an output microstrip line 36, a circular microstrip ring 38, and semiconductor device or devices 40 formed within substrate 30 directly beneath microstrip ring 38. The conductive layer 32 is disposed on one face of the semiconductor substrate 30 such that the entire face is covered by a conductive material. Disposed on the opposite face of the semiconductor substrate 30 are microstrip ring 38 and input 34 and output 36 microstrip lines. Input and output microstrip lines 34 and 36, microstrip ring 38, and conductive layer 32, all preferably formed of a highly conductive material, are disposed onto the surfaces of substrate 30 employing any well-known method. The thickness of these components should be at least several skin depths to help ensure that electromagnetic waves cannot pass through the conductive material and escape from the device structure. Theoretically, electromagnetic waves cannot penetrate a perfect conductor, but since a perfect conductor does not exist, electromagnetic waves will tend to penetrate all conductive materials to a certain degree. The depth at which the electromagnetic field of the wave decays by a factor of $e^{-1}$ or 0.37 is called the skin depth and this skin depth is a function of the frequency of the wave as well as the type of material. Thus, the thickness of microstrip means 34 and 36, microstrip ring 38, and conductive layer 32 may vary according to the frequency of the input electromagnetic signal and the conductive material used.

Referring to the top view of the embodiment provided in FIG. 3, input and output microstrip lines 34 and 36 are disposed on opposite sides of microstrip ring 38 along the same imaginary centerline 4 with intervening gaps 42. Gaps 42 are designed to be quite small (on the order of a few microns) so that electromagnetic signals may traverse the gaps, thereby electromagnetically coupling the two microstrip lines 34 and 36 to the microstrip ring 38. Imaginary centerline 4 preferably passes through the center 44 of the microstrip ring 38 such that the ring is divided into two portions 46 and 48 having substantially equal electromagnetic impedances. The two portions 46 and 48 are coupled to each other at first and second junctions 50 and 52. The input 34 and output 36 microstrip lines are also electromagnetically coupled to the microstrip ring 38 at the first 50 and the second 52 junctions, respectively.

A cross-sectional view of the embodiment of FIG. 3 is provided in FIG. 4 wherein the elements corresponding to those of FIG. 3 are labelled with identical numbers. As FIG. 4 is drawn, half of the microstrip ring 38 extends out of the page and half extends into the page. In this embodiment, the combination of the conductive layer 32 (also referred to as the ground plane) and the input microstrip line 34 forms an input waveguide. Likewise, the ground plane 32 and output microstrip line 36 form an output waveguide. The intermediate waveguide is formed by the microstrip ring 38 and the ground plane 32.

Figure 5:
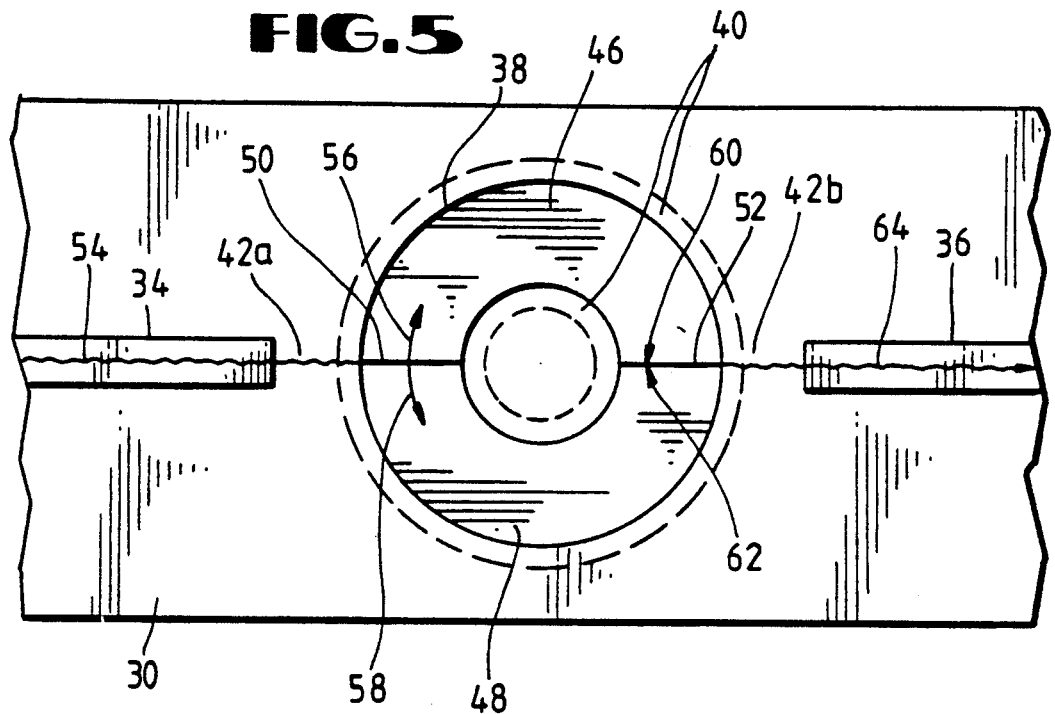
FIG. 5 is a top view of the embodiment of FIGS. 3 and 4 showing the paths taken by various signals.
Figure 6:
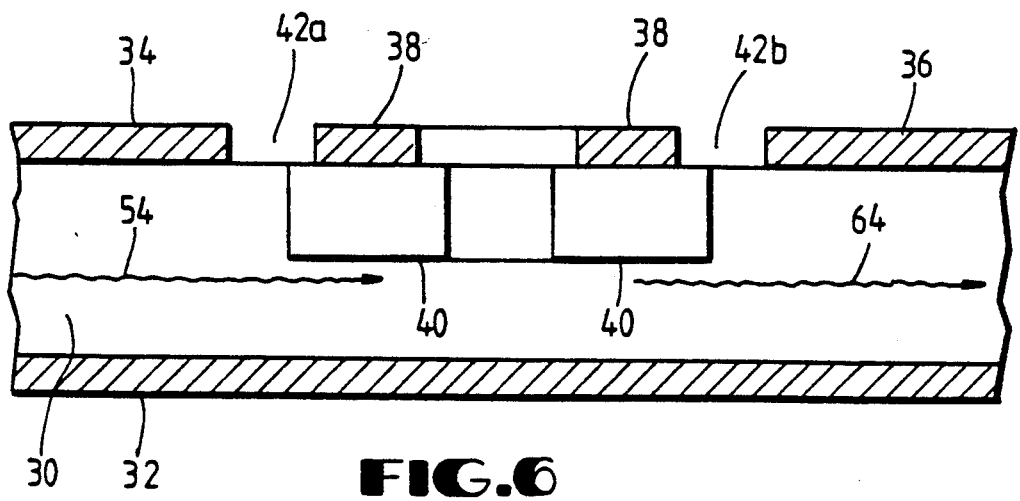
FIG. 6 is a cross-sectional view corresponding to FIG. 4 showing the propagation of the input and output signals.

Referring now to FIGS. 5 and 6 which provide a top and cross-sectional views, corresponding to FIGS. 3 and 4, the combination of the ground plane 32 and the input microstrip line 34 behaves as a parallel plate waveguide to direct the input electromagnetic signal 54 to gap 42a. Since microstrip 34 is quite narrow, it certainly is not an ideal parallel plate but, nonetheless, the ground plane microstrip combination is sufficient to convey almost all of the input signal to gap 42a. Since gap 42a is quite small, input electromagnetic signal 54 is able to traverse it to reach the first junction 50 of the intermediate waveguide. At junction 50, input signal 54 encounters two parallel paths 46 and 48 having substantially equal electromagnetic impedances. Consequently, input signal 54 splits into two separate signals 56 and 58 having substantially equal amplitudes. Signal 56 propagates between the upper portion 46 of the microstrip ring and the ground plane 32, while signal 58 propagates between the lower portion 48 of the microstrip ring and the ground plane 32. As both signals 56 and 58 travel along the circumference of the intermediate waveguide, the semiconductor device 40 beneath the microstrip ring processes at least one of the signals 56 and 58 to perform the desired operation or operations. It should be noted that device 40 may be a single continuous device which performs a single function, or it may comprise a plurality of different devices performing a number of different functions. In either case, signals 56 and 58, in travelling from junction 50 to junction 52, are converted to newly processed signals 60 and 62. At junction 52, the newly processed signals 60 and 62 recombine to form a single output signal 64. Since both signals travelled along substantially identical paths having substantially equal electromagnetic impedances, the recombination of the two signals will be in phase. Therefore, signals 60 and 62 interfere constructively, reinforcing each other to produce an output signal 64 which is greater in magnitude than either of the original signals 60 and 62. Once formed, output signal 64 traverses gap 42b to reach output microstrip line 36 and thereafter propagates between microstrip 36 and ground plane 32 to exit from the signal processor.

Figure 7:
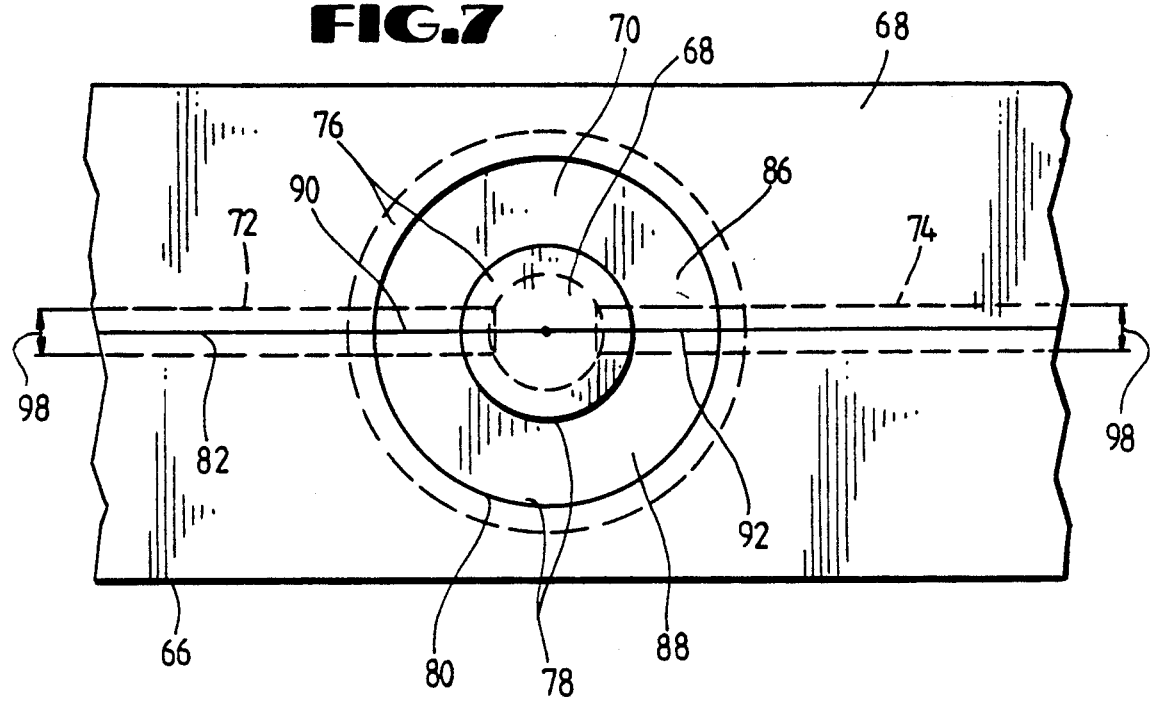
FIG. 7 is a top view of a second preferred embodiment of the invention.
Figure 8:
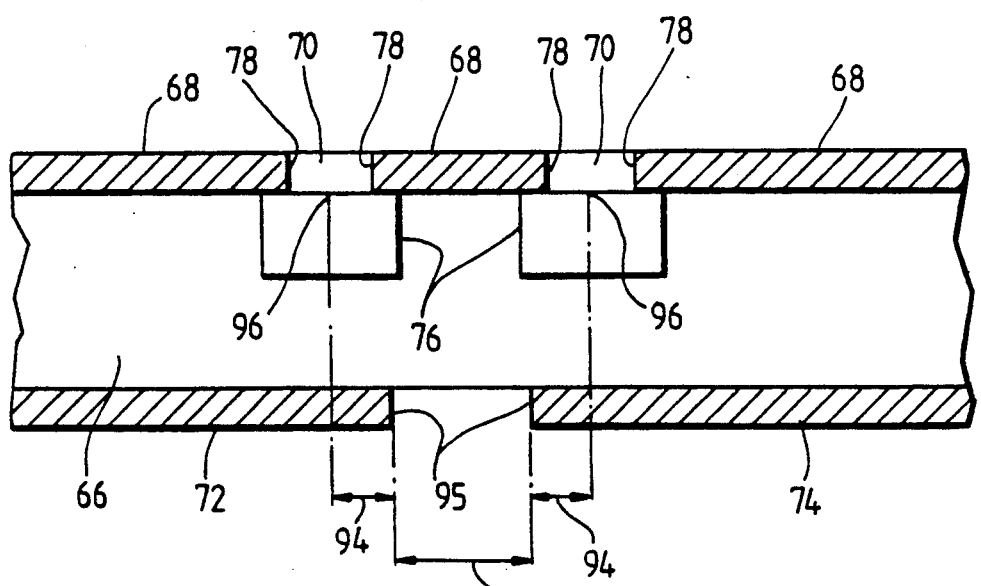
FIG. 8 is a cross-sectional view of the embodiment of the invention shown in FIG. 7 taken along the section lines 8—8.

A second preferred embodiment of the invention is depicted in FIGS. 7 and 8 wherein the signal processor comprises a semiconductor substrate 66, a layer of conductive material 68 absent an annular portion 70, an input microstrip line 72, an output microstrip line 74, and a semiconductor device 76 formed within the substrate 66. Using any well-known method, conductive layer 68 is disposed, onto one face of the substrate 66 such that the conductive layer covers the entire face of the substrate except for an annular portion 70 which is left exposed. The exposed annular portion 70 and the surrounding conductive walls 78 combine to form a slotline ring 80. Formed beneath the slotline ring 80 is the semiconductor device 76 responsible for processing input electromagnetic signals. Referring to the top view of the embodiment provided in FIG. 7, microstrip lines 72 and 74 are disposed along the same imaginary centerline 82 and on opposite sides of the slotline ring 80. Microstrip lines 72 and 74 are positioned relative to the slotline ring 80, as shown in FIG. 7, such that an imaginary plane 84, extending into and out of the paper, divides the ring 80 into two portions 86 and 88 having substantially equal electromagnetic impedances. Input microstrip line 72 is electromagnetically coupled to both portions 86 and 88 at a first junction 90, and output microstrip line 74 is electromagnetically coupled to portions 86 and 88 at a second junction 92.

Referring now to the cross-sectional view of the embodiment shown in FIG. 8, the horizontal distance 94 between the ends 95 of the microstrips 72 and 74 and the center of the ring width 96 is preferably designed to be a quarter of a wavelength for maximum electromagnetic coupling. Distance 94 may vary depending on the frequency of the input electromagnetic signals. The separation 100 between the two microstrip lines 72 and 74 is preferably designed to be at least twice the width 98 (FIG. 7) of the two microstrip lines so that the two microstrips 72 and 74 are electromagnetically decoupled. Thus, electromagnetic signals cannot traverse gap 100 to travel from one microstrip to another. In this embodiment, the input waveguide is formed by input microstrip line 72 and conductive layer 68. Likewise, the output waveguide is formed by output microstrip line 74 and conductive layer 68. The slotline ring 80 itself comprises the intermediate waveguide.

Figure 9:
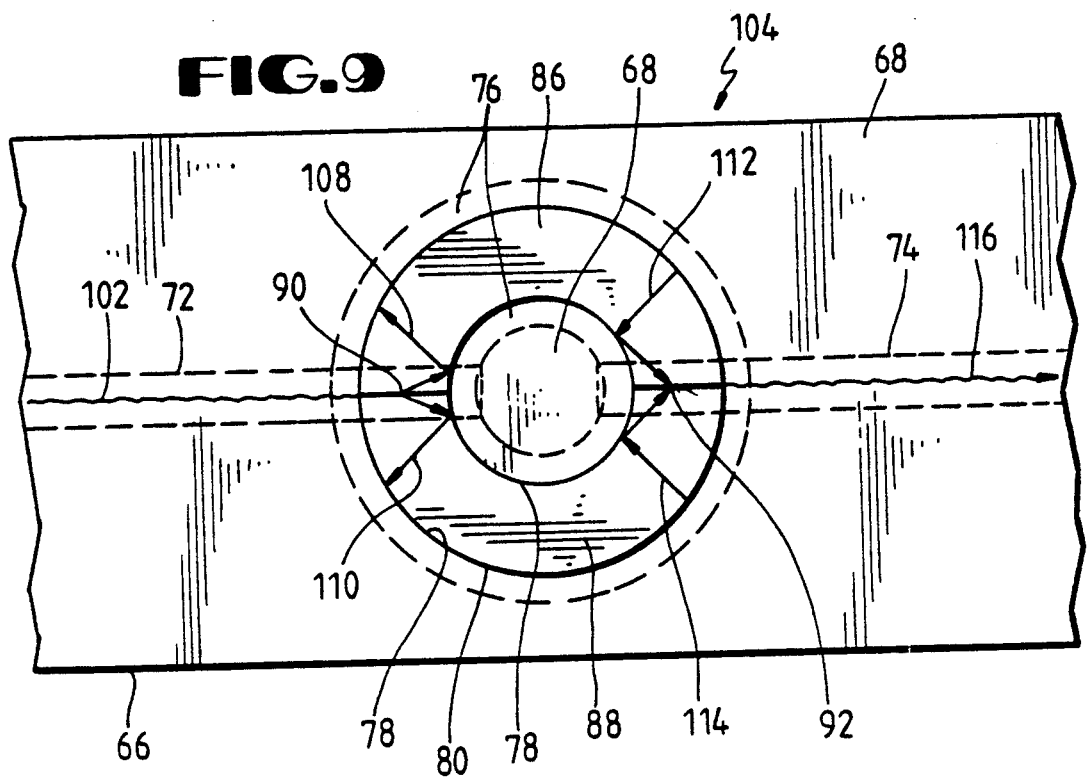
FIG. 9 is a top view corresponding to FIG. 7 illustrating the propagation of signals between the conductive walls of the slotline ring.
Figure 10:
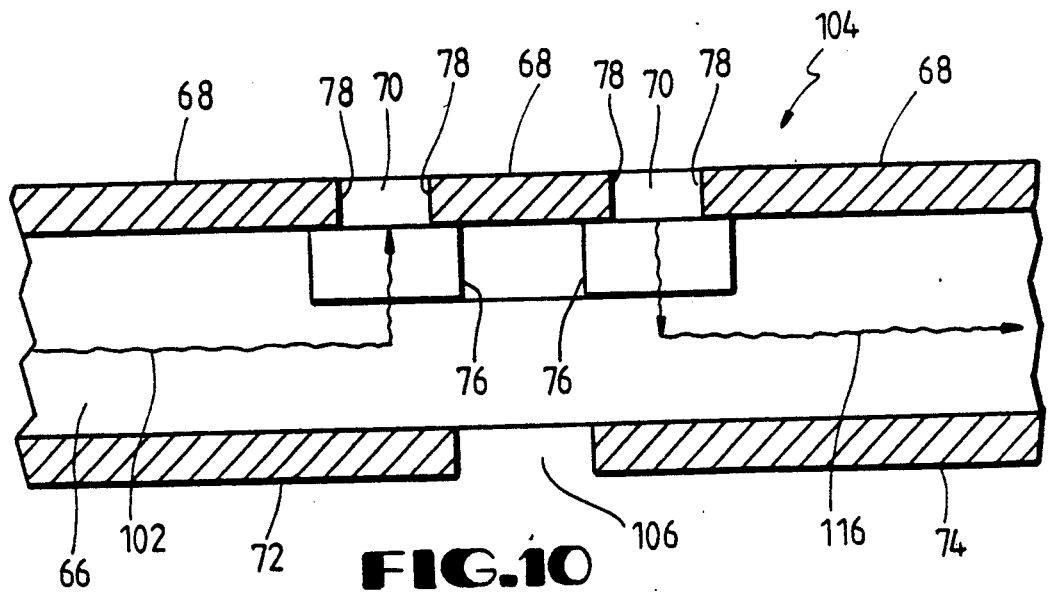
FIG. 10 is a cross-sectional view corresponding to FIG. 8 illustrating how the input and output signals are steered toward the slotline ring.

Referring now to FIGS. 9 and 10, input electromagnetic signal 102 enters the signal processor 104 via the input waveguide and propagates between conductive layer 68 and input microstrip line 72 of the input waveguide until it encounters gap 106. Since gap 106 is designed to be of sufficient width to electromagnetically decouple microstrip 72 from microstrip 74, input signal 102 cannot traverse the gap 106. Therefore, signal 102 is steered upwards towards junction 90 of the slotline ring 80. At junction 90, signal 102 encounters two parallel paths 86 and 88 having substantially equal electromagnetic impedances. Accordingly, signal 102 separates into two signals 108 and 110 having substantially equal magnitudes with signal 108 propagating along the upper portion 86 of the slotline ring and signal 110 propagating along the lower portion 88 of the slotline ring 80. It should be noted that electromagnetic signals travelling along the slotline ring 80 propagate laterally between the conductive walls 78 of the slotline ring as shown in FIG. 9. As signals 108 and 110 travel along the two portions 86 and 88 of the slotline ring, they are processed by semiconductor device 76 and converted to newly processed signals 112 and 114. At the second junction 92 of the ring 80, signals 112 and 114 recombine to form output signal 116 and, as was the case with the first embodiment, signals 112 and 114 recombine in phase so that they reinforce each other to produce an output 16 which is larger in magnitude than either of the original signals 112 and 114. At junction 92, the slotline ring 80 is electromagnetically coupled to the output waveguide formed by conductive layer 68 and output microstrip 74 so that output signal 116 may exit the signal processor via the output waveguide.

Though this second embodiment is somewhat more difficult to produce than the first, it has the extra advantage of being optically controllable. Because the semiconductor device 76 is left exposed, optical signals may be easily coupled to the device 76 to control its gain, to generate electromagnetic signals, to modulate the input signal, to injection lock the signal, or to perform a number of other functions. Optically controllable devices are desirable in many applications.

Both of the embodiments of the invention described thus far offer several distinct advantages over the prior art. First of all, both embodiments are distributive structures which may be fabricated monolithically. Thus, the signal processor of the present invention may be inexpensively mass-produced. Also, both embodiments, due to the ring-like structure of the intermediate waveguide, provide improved impedance characteristics when compared to the linear structure of the prior art. All ring structures have an inherent resonant frequency and it has been found that, when electromagnetic signals having the same frequency as the resonant frequency are sent to a ring structure, very little of the input signal is reflected. This means that the ring structure has a matching impedance. Therefore, for any frequency of electromagnetic signal, a specific ring structure may be designed such that a matching impedance is attained. The designing of a resonant ring structure to achieve a specific resonant frequency is described in detail in Foundations For Microstrip Circuit Design by T. C. Edwards, Wiley and Sons, 1981, and is hereby incorporated by reference. Though the reference only mentions microstrip ring resonators, the same principles may be applied to slotline rings as well.

An additional advantage provided by both embodiments is that they provide higher gain than the prior art when used as an amplifier. Due to the process of dividing the input signal into two signals, processing each signal separately, and recombining the two signals to form a single output signal, the gain derived from the signal processor of the present invention is higher than that from the amplifiers of the prior art. Yet a further advantage offered by both embodiments of the invention is versatility. Both embodiments may be employed to implement a variety of devices. The semiconductor material of the substrate and the semiconductor device formed within the substrate may vary from one implementation to another but the overall device structure remains the same.

To illustrate the versatility of this invention, several examples of possible implementations will now be described.

IMPATT Distributive Amplifier

One possible application of the first embodiment is as an IMPATT distributive amplifier such as that shown in FIG. 11, wherein the signal processor comprises a semiconductor substrate 30, input and output microstrip lines 34 and 36, ground plane 32, microstrip ring 38, and IMPATT device 40. For this implementation, substrate 30 is preferably a silicon, gallium arsenide, or indium phosphide substrate. The semiconductor device 40, referred to as an IMPATT (impact avalanche transit time) device, comprises three regions: a highly doped p+ region 122 for generating the charge carrying holes, a moderately doped n region 120 for the charge carrying holes to travel through, and a highly doped n+ region 118 for providing good ohmic contact with microstrip ring 38. The fabrication of different regions within a semiconductor substrate is well known in the art and may be accomplished using a number of different methods. For typical n+np+ single drift IMPATT devices, the doping concentrations for the n+, n, and p+ regions may be as follows:

$n+ = 10^{19}/cm^3$ to $10^{20}/cm^3$;
$n = 10^{16}/cm^3$ to $5 \times 10^{17}/cm^3$; and
$p+ = 10^{19}/cm^3$ to $10^{20}/cm^3$.

Typical n-type doping materials include arsenic, phosphorus, and antimony while the p-type doping materials include boron, gallium, and indium. The semiconductor device 40 is preferably fabricated beneath all portions of the microstrip ring 38 so that after the input signal 54 splits into two separate signals, both of the signals are continuously amplified as they propagate from the first junction of the intermediate waveguide to the second junction. An electrical voltage may be applied to the semiconductor device 40 through biasing electrodes 124 to provide the bias necessary for the proper functioning of the device 40 as an amplifier. As stated previously, the present invention used as an amplifier will provide higher gain than the linear amplifiers of the prior art given identical semiconductor devices 40 and propagation lengths.

Gunn-Effect Amplifier

A possible implementation of the second embodiment of the invention is as a Gunn-effect amplifier such as the one depicted in FIG. 12, comprising a semiconductor substrate 66, conductive layer 68, input and output microstrip lines 72 and 74, slotline ring 80, and semiconductor device 76. Semiconductor device 76, having a large n region 126 and two small n+ regions 128, is fabricated within substrate 66 which is preferably composed of a III-V compound such as gallium arsenide. Gallium arsenide and other III-V compounds exhibit the double layer conduction band characteristic and this characteristic is essential for Gunn-effect devices. The doping concentration of the n region 126 typically ranges from $10^{15}/cm^3$ to $10^{16}/cm^3$ using arsenic, phosphorus, or antimony as the doping material. The n+ regions 128, used to provide good electrical contacts between conductive layer 68 and device 76, are usually doped to a concentration of $10^{18}/cm^3$. Semiconductor device 76 is preferably fabricated beneath all portions of the slotline ring 80. Electrical biases may be applied to device 76 through biasing electrodes 130. For the signal processor depicted in FIG. 12 to function properly, device 76 must be biased until it is within the negative differential resistance range. Once within this range, device 76 begins to exhibit the Gunn-effect, at which time it may be used as an amplifier. Care should be taken in designing the overall circuit to ensure that the Gunn device 76 will behave as an amplifier. To elaborate, FIG. 13 shows the Gunn device 76 having a device impedance $Z_d$ connected to a circuit 133 having overall impedance $Z_c$. Because device 76 is biased into the negative differential resistance region, its impedance will be given by, $$Z_d = -R_d + j X_d$$

where $-R_d$ represents the real or resistive part of the device's impedance and $X_d$ represents the imaginary or reactive part of the device's impedance. The impedance of the circuit 133 is given by, $$Z_c = R_c + j X_c.$$

For the overall circuit to function as an amplifier, $$R_c + (-R_d) > 0.$$

In other words, the overall resistance of the entire circuit (device plus circuit) must be greater than zero. The impedance $Z_d$ of device 76 is a function of frequency (f), DC current ($I_o$), RF current ($I_{RF}$), and temperature (T) while the circuit impedance $Z_c$ is a function of frequency (f). Thus, many factors may be taken into consideration when designing the amplifier. The design of Gunn amplifiers is known in the art and need not be further discussed herein.

In this embodiment, optical signals 131 as shown in FIG. 12 may be easily coupled to Gunn device 76 to control the operation of the device. Optical signals 131 may be used to control the gain of the device, to modulate the input signals, to injection-lock the input signals, to generate electromagnetic signals, or to perform a number of other functions.

Gunn-Effect Oscillator

The signal processor depicted in FIG. 12 may also be used as an oscillator if the following criteria are met:

$$X_d = -X_c; \text{ and (1)}$$

$$|R_d| > R_c. \text{ (2)}$$

The first criterion stipulates that the impedances of device 76 and circuit 133 (FIG. 13) must have equal and opposite imaginary parts. The second criterion stipulates that the resistance of the entire circuit (device plus circuit) must remain negative. If both criteria are satisfied, the signal processor of FIG. 12 will function as an oscillator to produce periodic signals having a frequency equal to the resonant frequency of the slotline ring 80. By adjusting the resonant frequency of the ring, a wide range of oscillating frequencies may be attained.

Since oscillators require no input, the input waveguide comprising microstrip 72 and conductive layer 68 (FIG. 12) is not necessary for this particular application.

Multiple Function - Multiple Device Implementation

Figure 14:
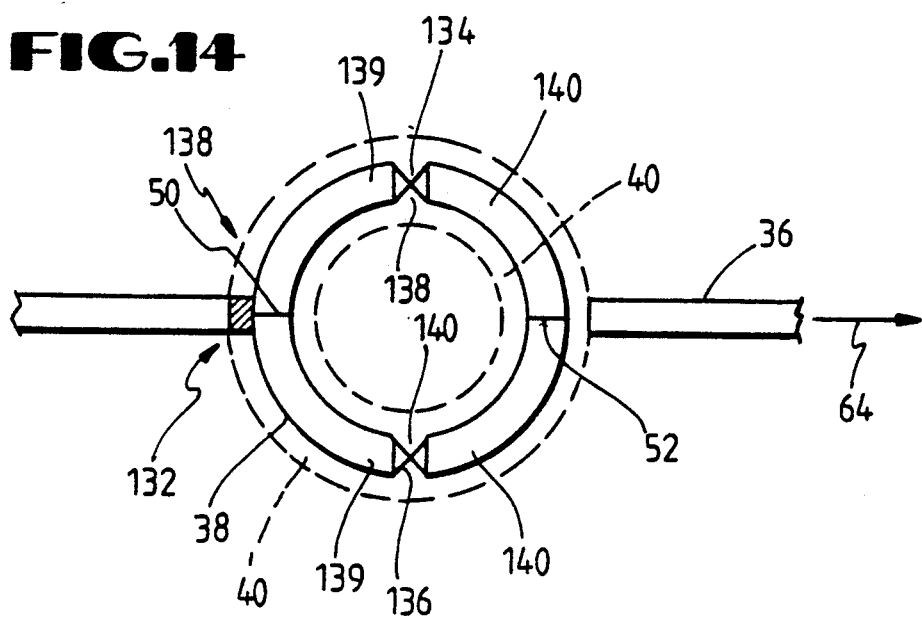
FIG. 14 illustrates a multiple device multiple function implementation of the embodiment of the invention shown in FIG. 3.

An implementation showing the full versatility of the present invention is depicted in FIG. 14 wherein the first embodiment is employed to implement a multiple function-multiple device signal processor comprising microstrip ring 38, semiconductor device 40, output microstrip line 36, photodetector 132, PIN device 134, and varactor 136. Signal 138 is a modulated optical signal comprising an optical frequency signal and a lower frequency microwave signal superimposed on the optical signal. The lower frequency microwave signal is the one which needs to be processed. The optical signal is simply used as a carrier signal much like the higher frequency signals of regular radio transmissions are used to carry the voice signals. The photodetector 132, of regular construction, is disposed adjacent to the first junction 50 of the microstrip ring 38 and functions to receive and demodulate input optical signal 138 so as to extract the lower frequency signal from the input optical signal 138. At junction 50, the extracted signal separates into two signals with both signals being processed by semiconductor device 40. Device 40 may be an IMPATT amplifier such as the one previously described or it may be a number of other semiconductor devices.

The microstrip ring 38 of FIG. 14 contains two discontinuities, one at gap 140 and the other at gap 141. A PIN device 134 is disposed within the gap 140 so as to be electrically coupled to both pieces 139 and 142 of the microstrip ring 38. The PIN device may be used as an electrical switch to turn the circuit "ON" and "OFF." Disposed within gap 141 is varactor 136. Varactor 136 is simply a pn junction. By changing the bias to the varactor 136, the depletion region of the pn junction is changed. This, in turn, alters the capacitance of the varactor, thereby changing the effective length of the microstrip ring. If the effective length of the ring is changed, its resonant frequency is also changed. Therefore, varactor 136 may be used as a tuner to adjust the resonant frequency of the ring so that each ring may resonate within a range of frequencies. In this application, the input signal is conveyed to the signal processor via the light signal 138, not by the input waveguide. Thus, input microstrip 34 is not necessary for this implementation.

The implementations described above represent but a few of the possible applications of the present invention. By changing the material of the substrate and the device formed within the substrate, the signal processor of the present invention may be employed to perform many other different functions.

Figure 15:
FIG. 15 illustrates alternate geometries 51A and 51B for the intermediate waveguide.
Figure 16:
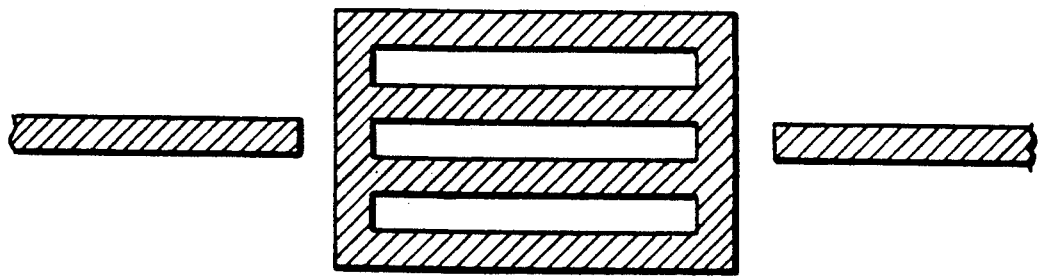
FIG. 16 illustrates an intermediate waveguide having more than two branches or paths.

Though the invention has been described with reference to specific embodiments, it should not be construed to be so limited. Many modifications may be made to the preferred embodiments without departing from the spirit of the invention. For example, it is not vital that the intermediate waveguide be in the form of a ring. Many other configurations, such as configuration 51A and 51B of FIG. 15, may be employed. The ring structure is preferred simply because it exhibits the best impedance characteristic. Also, even though the intermediate waveguide has been described as having only two parallel propagation paths, more parallel paths may be used if so desired. One such alternate configuration is depicted in FIG. 16. In addition, even though the propagation paths of the intermediate waveguide have been described as having substantially equal impedances, they may have unequal impedances if so desired. Their impedances are preferable equal to help ensure that the recombination of the two separate signals will be in phase. However, it is envisioned that there may be applications in which it desirable to recombine the signals out of phase. In those cases, unequal impedances may be preferred. It is further envisioned that pn junctions or Schottky - barrier devices may be formed beneath the input and output microstrip lines as well as beneath the intermediate waveguide to form a non-linear transmission line. This transmission line may be used as a phase shifter, a delay line, a pulse compressor, a frequency mixer, a detector, or a mixer. These and other modifications may be effected without departing from the spirit of the invention. Therefore, the invention should not be limited by the embodiments employed to describe it but only by the scope of the appended claims.

WHAT IS CLAIMED IS:

1. An electromagnetic signal processor comprising:
   (a) an input waveguide for receiving input electromagnetic signals;
   (b) an output waveguide for transmitting output electromagnetic signals;
   (c) an intermediate branched waveguide comprising a plurality of branches electromagnetically coupled together at a first and a second junction, said input and output waveguides being electromagnetically coupled to said intermediate waveguide at said first and second junctions, respectively;
   said intermediate waveguide being adapted to receive an input electromagnetic signal from said input waveguide at said first junction, divide said input electromagnetic signal into a plurality of separate signals such that each of said separate signals propagates along one of said branches of said intermediate waveguide, recombine said separate signals into a single output electromagnetic signal at said second junction, and send said output electromagnetic signal to said output waveguide; and
   (d) at least one semiconductor device electrically coupled to said intermediate waveguide for processing at least one of said separate signals as said separate signals propagate along said branches of said intermediate waveguide.

2. The signal processor of claim 1 wherein all of said branches of said intermediate waveguide have substantially equal electromagnetic impedances.

3. The signal processor of claim wherein said intermediate waveguide comprises two branches having substantially equal electromagnetic impedances coupled to each other at a first and a second junction to form a closed geometric configuration.

4. The signal processor of claim 3 wherein said closed geometric configuration is a circular ring.

5. The signal processor of claim 1 wherein said input waveguide comprises a conductive microstrip line and a layer of conductive material.

6. The signal processor of claim 5 wherein said output waveguide comprises a conductive microstrip line and a layer of conductive material.

7. The signal processor of claim 6 wherein said intermediate waveguide comprises a conductive microstrip ring and a layer of conductive material.

8. The signal processor of claim 6 where said intermediate waveguide is a slotline-ring.

9. The signal processor of claim 8 wherein at least one semiconductor device is optically controlled.

10. A method for processing electromagnetic signals in a resonant ring structure comprising the steps of:
    (a) receiving an input electromagnetic signal;
    (b) dividing said input electromagnetic signal into a plurality of separate electromagnetic signals;
    (c) processing at least one of said separate signals;
    (d) recombining said separate signals into a single electromagnetic output signal; and
    (e) outputting said output signal.

11. The method of claim 10 wherein said separate signals have substantially equal amplitudes.

12. The method of claim 10 wherein said input electromagnetic signal is divided into two separate signals having substantially equal amplitudes.

13. The method of claim 10 wherein all of said separate signals are processed according to predetermined specifications.

14. The method of claim 10 wherein at least one of said separate signals is processed according to optical control signals.

15. An electromagnetic signal processor comprising:
    (a) a semiconductor substrate having a first and a second face;
    (b) a planar layer of conductive material disposed on said first face of said semiconductor substrate;
    (c) a conductive ring disposed on said second face of said semiconductor substrate;
    (d) an input microstrip line disposed on said second face having one end within close proximity to a portion of said conductive ring to define a small dielectric gap separating said one end of said input microstrip line from said conductive ring, said dielectric gap being sufficiently small so as to electromagnetically couple said input microstrip line to said conductive ring at a first junction;
    (e) an output microstrip line also disposed on said second face having one end within close proximity to a portion of said conductive ring to define a small dielectric gap separating said one end of said output microstrip line from said conductive ring; said dielectric gap being sufficiently small so as to electromagnetically couple said output microstrip line to said conductive ring at a second junction; and
    (f) a semiconductor device, formed within said semiconductor substrate, electrically coupled to said conductive ring.

16. The signal processor of claim 15 wherein said first and second junctions are placed relative to each other so as to divide said microstrip ring into two branches having substantially equal electromagnetic impedances.

17. An electromagnetic signal processor comprising:
    (a) a semiconductor substrate having a first and a second face;
    (b) a planar conductive layer, having an annular portion missing, disposed onto said first face of said semiconductor substrate such that said conductive layer leaves only an annular portion exposed;
    (c) an input microstrip line disposed on said second face of said semiconductor substrate having one end terminating opposite said annular portion so as to electromagnetically couple said input microstrip line to said annular portion at a first junction;
    (d) an output microstrip line also disposed on said second face of said semiconductor substrate having one end terminating opposite said annular portion so as to electromagnetically couple said output microstrip line to said annular portion at a second junction; said input and output microstrip lines being separated from each other sufficiently to electromagnetically decouple them; and (e) a semiconductor device formed within said semiconductor substrate adjacent to said annular portion.

18. The signal processor of claim 17 wherein said first and second junctions are placed relative to each other so as to divide said annular portion into two half portions having substantially equal electromagnetic impedances.

19. The signal processor of claims 17 wherein said semiconductor device is optically controlled.

20. An electromagnetic signal processor, comprising:
(a) a branched resonant waveguide having at least two non-linear branches coupled together at an input junction and at an output junction, said input junction being adapted to receive an input electromagnetic signal;
(b) at least one semiconductor device electrically coupled to said branched waveguide for processing an electromagnetic signal in at least one of the branches of said branched waveguide; and
(c) an output waveguide electromagnetically coupled to said second junction.

21. The signal processor of claim 20, further comprising an input waveguide electromagnetically coupled to said first junction.

22. The signal processor of claim 20, further comprising a phototransducer electromagnetically coupled to said first junction and capable of transmitting an electromagnetic signal to said first junction in response to optical signals received by said phototransducer.

23. The signal processor claim 17 wherein said branches of said branched waveguide possess substantially equal electromagnetic impedances.

24. The signal processor of claim 20 wherein said semiconductor device is optically controlled.

* * * * *